(12) United States Patent
Zhang et al.

(10) Patent No.: US 11,516,916 B1
(45) Date of Patent: Nov. 29, 2022

(54) STORAGE DRIVE WITH CAPACITOR MODULE

(71) Applicant: Dell Products L.P., Round Rock, TX (US)

(72) Inventors: Kunzheng Zhang, Shanghai (CN); Sandburg Hao Hu, Shanghai (CN); Qianwen Bian, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/450,487

(22) Filed: Oct. 11, 2021

(30) Foreign Application Priority Data

Sep. 3, 2021 (CN) .......................... 202111035873.2

(51) Int. Cl.
| | |
|---|---|
| *H05K 1/14* | (2006.01) |
| *H05K 1/11* | (2006.01) |
| *H05K 1/18* | (2006.01) |
| *G06F 3/06* | (2006.01) |

(52) U.S. Cl.
CPC .......... *H05K 1/141* (2013.01); *G06F 3/0679* (2013.01); *H05K 1/117* (2013.01); *H05K 1/181* (2013.01); *H05K 2201/10015* (2013.01); *H05K 2201/10159* (2013.01)

(58) Field of Classification Search
CPC ..................................................... H05K 1/141
USPC ........................................................ 361/748
See application file for complete search history.

(56) References Cited

U.S. PATENT DOCUMENTS

| | | | | |
|---|---|---|---|---|
| 5,276,590 A | * | 1/1994 | Budman | H05K 7/1461 |
| | | | | 174/250 |
| 7,035,116 B2 | * | 4/2006 | Kuzmenka | G11C 5/00 |
| | | | | 361/776 |
| 7,310,240 B2 | * | 12/2007 | Petersen | G06F 1/26 |
| | | | | 361/791 |
| 8,102,657 B2 | * | 1/2012 | Hiew | H05K 5/0278 |
| | | | | 439/55 |
| 11,289,269 B2 | * | 3/2022 | Suzuki | H01F 38/14 |
| 11,431,257 B2 | * | 8/2022 | Nagelmüller | H05K 7/20254 |
| 2008/0089042 A1 | * | 4/2008 | Deck | H05K 1/141 |
| | | | | 361/784 |
| 2015/0366063 A1 | * | 12/2015 | Takagi | H01L 23/49811 |
| | | | | 29/831 |
| 2019/0215960 A1 | * | 7/2019 | Long | H01R 12/73 |
| 2020/0227393 A1 | * | 7/2020 | Kim | H01L 24/32 |
| 2020/0344869 A1 | * | 10/2020 | So | H01L 24/20 |
| 2021/0367360 A1 | * | 11/2021 | Chen | H05K 1/183 |

* cited by examiner

*Primary Examiner* — Stanley Tso

(74) *Attorney, Agent, or Firm* — McDermott Will & Emery LLP

(57) ABSTRACT

A storage drive, including: a main module, including: a main printed circuit board (PCB) having a first side positioned opposite to a second side; flash memory components positioned on the main PCB at a first end of the storage drive, a controller module positioned on the main PCB at a second end of the storage drive opposite to the first end; and a capacitor module, including: a module printed circuit board (PCB) having a first side positioned opposite to a second side; a plurality of capacitors positioned on the module PCB on the first side of the module PCB, wherein the capacitor module is coupled to the main module such that the capacitor module is positioned at the first end of the storage drive and the first side of the capacitor module faces the first side of the main module.

16 Claims, 4 Drawing Sheets

STORAGE DRIVE WITH CAPACITOR MODULE

BACKGROUND

Field of the Disclosure

The disclosure relates generally to an information handling system, and in particular, a storage drive with a capacitor module.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Storage drives of information handling systems can include capacitors. However, capacitors can have a large size, and thus, occupy a large space on a storage drive such as a solid-state drive (SSD) on a printed circuit board (PCB). Inducing such large capacitors can prevent inclusion of additional flash memory components on the SSD PCB.

SUMMARY

Innovative aspects of the subject matter described in this specification may be embodied in a storage drive, including: a main module, including: a main printed circuit board (PCB) having a first side positioned opposite to a second side; flash memory components positioned on the main PCB at a first end of the storage drive, a controller module positioned on the main PCB at a second end of the storage drive opposite to the first end; and a capacitor module, including: a module printed circuit board (PCB) having a first side positioned opposite to a second side; a plurality of capacitors positioned on the module PCB on the first side of the module PCB, wherein the capacitor module is coupled to the main module such that the capacitor module is positioned at the first end of the storage drive and the first side of the capacitor module faces the first side of the main module.

Other embodiments of these aspects include corresponding systems and apparatus.

These and other embodiments may each optionally include one or more of the following features. For instance, the storage drive is a solid-state drive (SSD) storage drive. The capacitor module further includes a signal connector positioned on the first side of the capacitor module, the signal connector connecting the capacitor module to the main module to transmit signals between the capacitor module and the main module. The signal connector includes multiple pins that directly contact pads of the main module. The signal connector includes wires with connectors. The flash memory components are positioned on the first side and the second side of the main PCB. The plurality of capacitors face the flash memory elements that are positioned on the first side of the main PCB. The controller module is positioned on the first side of the main PCB.

Particular implementations of the subject matter described in this specification can be implemented so as to realize one or more of the following advantages. For example, space on a SSD PCB can be increased, leading to higher capacity and more compact SSDs.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
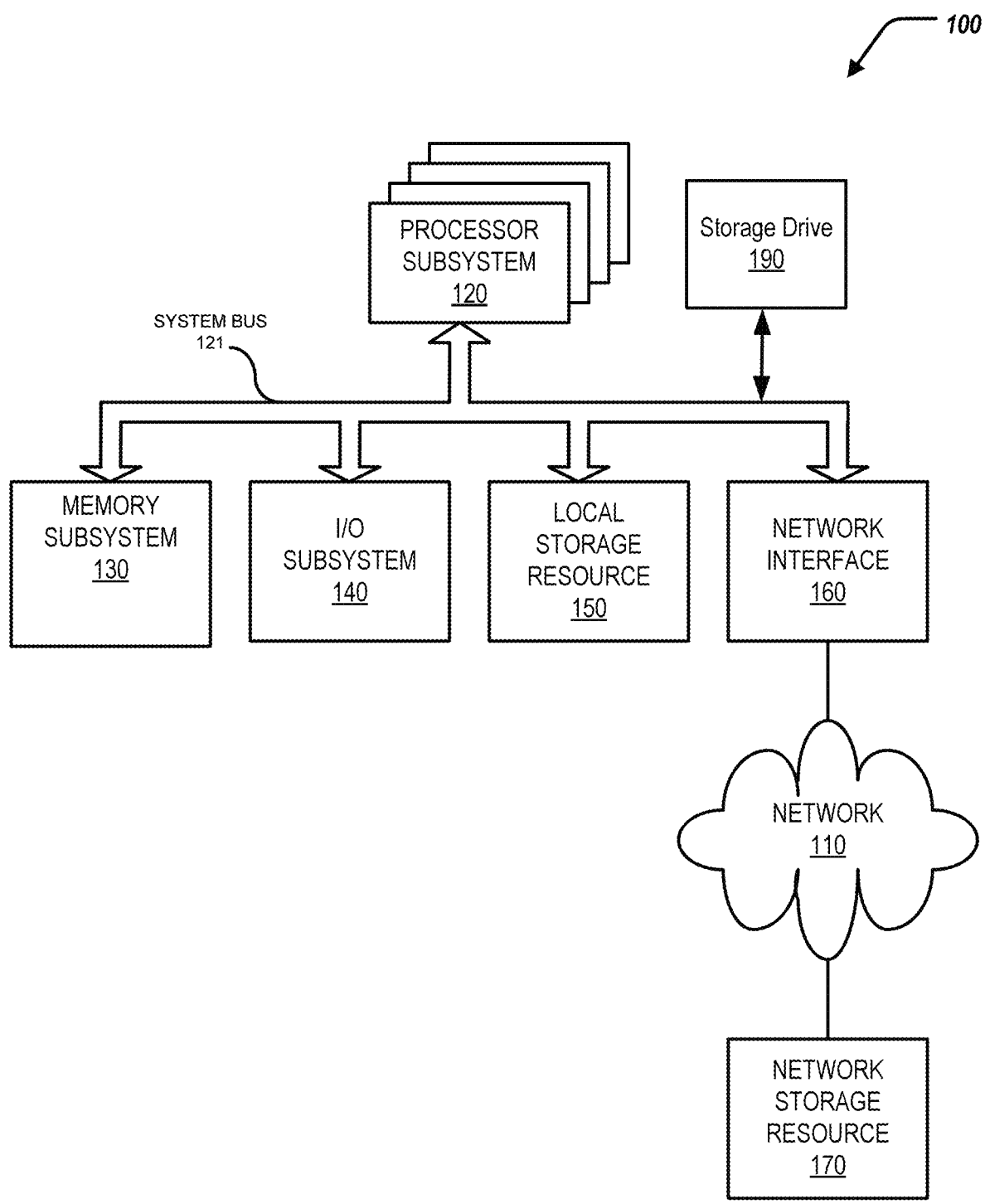
FIG. 1 is a block diagram of selected elements of an embodiment of an information handling system.

This disclosure discusses a storage drive, of an information handling system, that includes a capacitor module. In short, the storage drive can include the capacitor module that is installed on a case of the storage drive. The capacitor module can provide power to the storage drive during a power interruption. The coupling of the capacitor module with the storage drive as a flat capacitor module can increase usable board space of the storage drive by minimizing or eliminating fasteners for coupling.

Specifically, this disclosure discusses a storage drive, including a main module, including: a main printed circuit board (PCB) having a first side positioned opposite to a second side; flash memory components positioned on the main PCB at a first end of the storage drive, a controller module positioned on the main PCB at a second end of the storage drive opposite to the first end; and a capacitor module, including: a module printed circuit board (PCB) having a first side positioned opposite to a second side; a plurality of capacitors positioned on the module PCB on the first side of the module PCB, wherein the capacitor module is coupled to the main module such that the capacitor module is positioned at the first end of the storage drive and the first side of the capacitor module faces the first side of the main module.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

The information handling system 100 can further include a storage drive 190, such as a solid-state drive (SSD) card of a hard disk drive (HDD). The storage drive can have a form factor such as U.2 or E3.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, the storage drive 190 can include a capacitor module that is installed on a case of the storage drive 190. The capacitor module can provide power to the storage drive 190 during a power interruption. The coupling of the capacitor module with the storage drive 190 as a flat capacitor module can increase usable board space of the storage drive by minimizing or eliminating fasteners for coupling.

Figure 2:
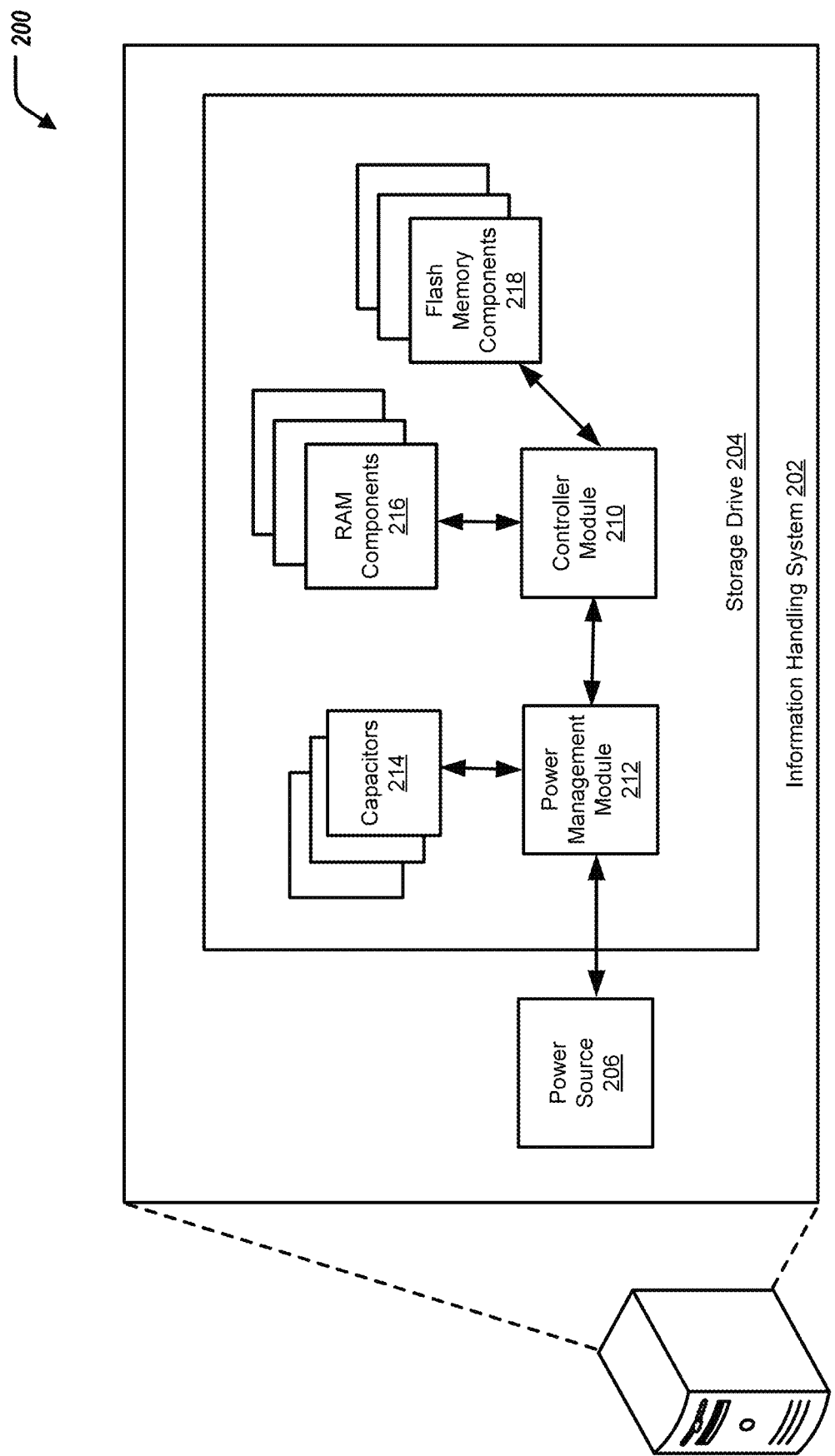
FIG. 2 illustrates a block diagram of an information handling system including a storage drive.

Turning to FIG. 2, FIG. 2 illustrates an environment 200 including an information handling system 202. The information handling system 202 can include a storage drive 204 and a power source 206. In some examples, the information handling system 202 is similar to, or includes, the information handling system 100 of FIG. 1. In some examples, the storage drive 204 is the same, or substantially the same, as the storage drive 190 of FIG. 1.

The storage drive 204 can include a controller module 210, a power management module (PMIC) 212, capacitors 214, RAM (DRAM) components 216, and flash (NAND) memory components 218. The controller module 210 can be in communication with the power management module 212, the RAM components 216, and the flash memory components 218. The power management module 212 can be in communication with the power source 206, the controller module 210, and the capacitors 214.

The power source 206 can include a battery, an AC adaptor, or both.

In short, the power source 206 can provide power (energy) to the power management module 212 (or PMIC 212). The power management module 212, during normal operation, can manage the power provided by the power source 206 to charge the capacitors 214. Additionally, the controller module 210 can manage data storage between the RAM components 216 and the flash memory components 218. To that end, if power is interrupted from the power source 206 (e.g. a surprise power off), the power management module 212 can direct power (energy) that is stored by the capacitors 214 to the controller module 210 (e.g., dozens of milliseconds of power). The controller module 210 can then perform a data backup (partially or wholly) of the data stored at the RAM components for storage at the flash memory components 218. The capacitors 214 additionally provide power to the flash memory components 218.

Figure 3:
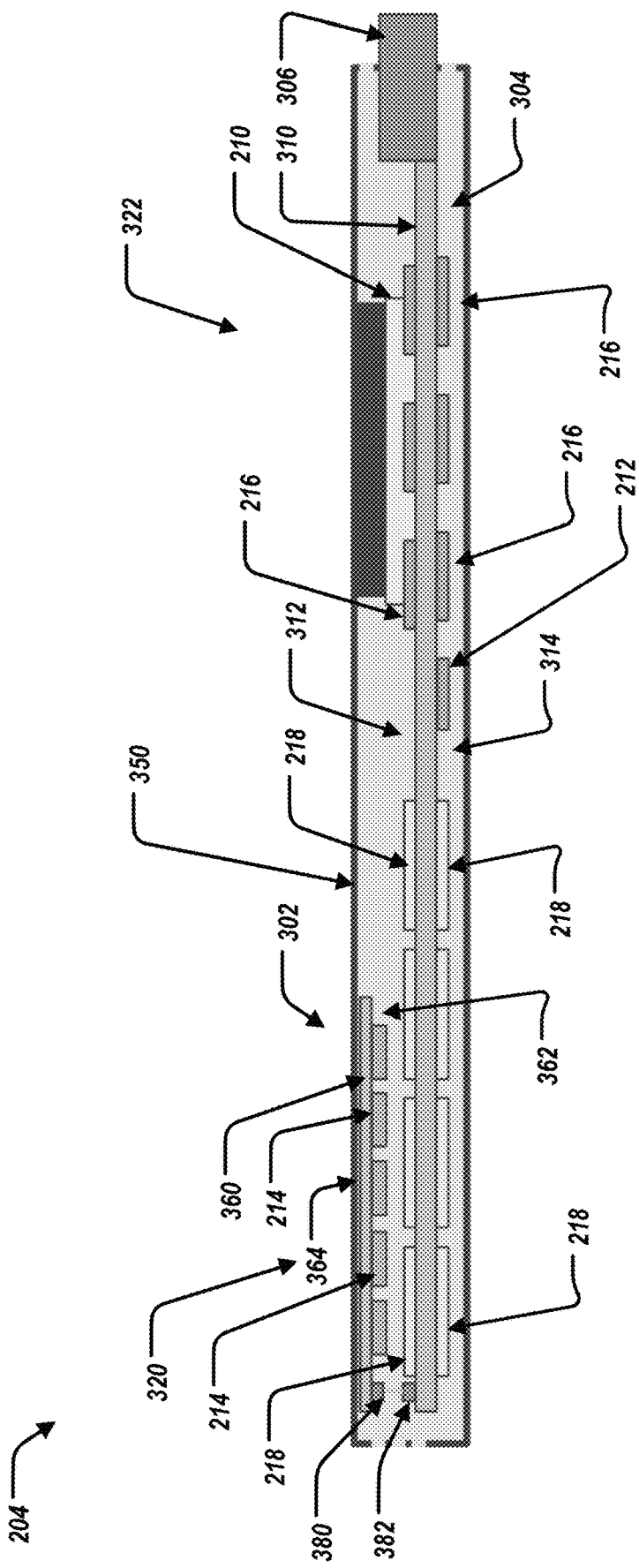
FIG. 3 illustrates a side view of the storage drive.

FIG. 3 illustrates a side view of the storage drive 204. The storage drive 204 can include a main module 302 and a capacitor module 304. The storage drive 204 can be any type of storage drive, including a solid-state drive (SSD) or a hard disk drive (HDD) storage drive, in such form factors as U.2 and E3. The storage drive 204, and in particular, the main module 302, can be coupled to a host backplane 306 (server backplane or storage backplane).

The storage drive 204 can further include a case 350. The case 350 can substantially surround the storage drive 204, and in particular, the main module 302 and the capacitor module 304.

The main module 302 can include a main printed circuit board (PCB) 310. The main PCB 310 can include a first side 312 positioned opposite to a second side 314. The main module 302 can further include the flash memory components 218. The flash memory components 218 can be positioned on the main PCB 310 at a first end 320 of the storage drive 204. The flash memory components 218 can be positioned on the first side 312 and/or the second side 314 of the main PCB 310.

The main module 302 can further include the controller module 210. The controller module 210 can be positioned on the main PCB 310 at a second end 322 of the storage drive 204. The second end 322 of the storage drive 204 is opposite to the first end 320 of the storage drive 204. Further, the controller module 210 is positioned on the first side 312 of the main PCB 310. Further, the controller module 210 can be in contact with a case contact 326 for thermal control of the controller module 210.

The main module 302 can further include the RAM components 216. The RAM components 216 can be positioned on the main PCB 310 at the second end 322 of the storage drive 204. The RAM components 316 can be positioned on the first side 312 and/or the second side 314 of the main PCB 310.

The main module 302 can further include the power management module 212. The power management module 212 can be positioned on the PCB 310 on the second side 314 of the main PCB 310.

Figure 4:
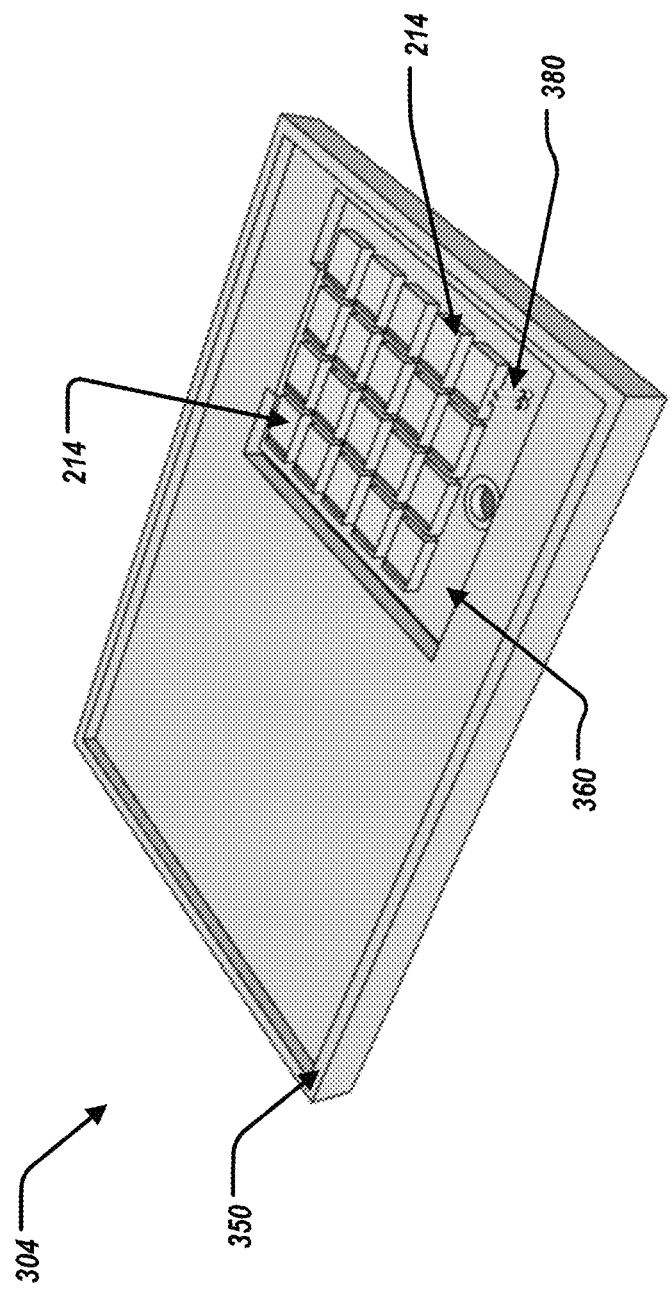
FIG. 4 illustrates a perspective view of a capacitor module of the storage drive.

The capacitor module 304 can include a module printed circuit board (PCB) 360. The module PCB 360 can include a first side 362 positioned opposite to a second side 364. The module PCB 360 can be positioned at the first end 320 of the storage drive 204. FIG. 4 illustrates a portion of the case 350 that includes the capacitor module 304.

The capacitor module 304 can further include the capacitors 214. The capacitors 214 can be positioned on the module PCB 360 on the first side 362 of the module PCB 360. In some examples, the capacitors 214 can face the flash memory elements 218 that are positioned on the first side 312 of the main PCB 310. For example, the capacitors 214 can include 20-30 capacitors (e.g., 7.3 mm×6.1 mm), with a total capacitive of up to 3000 micro-Faraday (uF).

The capacitor module 304 can further include a signal connector 380. The signal connector 380 can be positioned on the first side 362 of the capacitor module 304. The signal connector 380 can connect the capacitor module 304 to the main module 302 to transmit signals between the capacitor module 304 and the main module 302. Specifically, the main module 302 can further include a complimentary signal connector 382 positioned on the first side 312 of the main PCB 310. The signal connector 380 can be coupled to the complimentary signal connector 382 to transmit signals between the capacitor module 304 and the main module 302. In some examples, the signal connector 380 includes multiple pins that directly contact pads of the complimentary signal connector 382 of the main PCB 310. In some examples, the signal connector 380 includes wires with connectors that contact the complimentary signal connector 382 of the main PCB 310. In some examples, the signals transmitted between the capacitor module 304 and the main module 302 include ground and storage signals.

To that end, the capacitor module 304 is coupled to the main module 302 within the case 350. In other words, the case 350 includes both the main module 302 and the capacitor module 304 such that the capacitor module 304 is coupled to the main module 302. Furthermore, within the case 350, the first side 362 of the capacitor module 304 can face the first side 312 of the main module 302. That is, when the capacitor module 304 is coupled to the main module 302, the capacitor module 304 is positioned at the first end 320 of the storage drive 204, and further that the first side 362 of the capacitor module 304 faces the first side 312 of the main module 302. Additionally, the capacitors 214 can be positioned proximate to the main module 302, proximate to the first side 312 of the main PCB 310, and proximate to the flash memory components 218. Furthermore, the capacitor module 304 can be installed on (coupled with) the case 350 independent of fasteners/coupling with the main PCB 310. That is, the capacitor module 304 does not occupy space on the main PCB 310, or fasteners occupy space on the main PCB 310 coupling the capacitor module 304 to the main module 302 and/or the case 350. In other words, the coupling between the capacitor module 304 and the main module 302 is off-loaded to the case 350.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A storage drive, including:
   a main module, including:
      a main printed circuit board (PCB) having a first side positioned opposite to a second side;
      flash memory components positioned on the main PCB at a first end of the storage drive,
      a controller module positioned on the main PCB at a second end of the storage drive opposite to the first end; and
   a capacitor module, including:
      a module printed circuit board (PCB) having a first side positioned opposite to a second side;
      a plurality of capacitors positioned on the module PCB on the first side of the module PCB,
   wherein the capacitor module is coupled to the main module such that the capacitor module is positioned at the first end of the storage drive and the first side of the capacitor module faces the first side of the main module.

2. The storage drive of claim 1, wherein the storage drive is a solid-state drive (SSD) storage drive.

3. The storage drive of claim 1, wherein the capacitor module further includes a signal connector positioned on the first side of the capacitor module, the signal connector connecting the capacitor module to the main module to transmit signals between the capacitor module and the main module.

4. The storage drive of claim 3, wherein the signal connector includes multiple pins that directly contact pads of the main module.

5. The storage drive of claim 3, wherein the signal connector includes wires with connectors.

6. The storage drive of claim 1, wherein the flash memory components are positioned on the first side and the second side of the main PCB.

7. The storage drive of claim 6, wherein the plurality of capacitors face the flash memory elements that are positioned on the first side of the main PCB.

8. The storage drive of claim 1, wherein the controller module is positioned on the first side of the main PCB.

9. An information handling system, comprising:
   a processor;

memory media storing instructions executable by the processor to perform operations;
a storage drive, including:
    a main module, including:
        a main printed circuit board (PCB) having a first side positioned opposite to a second side;
        flash memory components positioned on the main PCB at a first end of the storage drive,
        a controller module positioned on the main PCB at a second end of the storage drive opposite to the first end; and
    a capacitor module, including:
        a module printed circuit board (PCB) having a first side positioned opposite to a second side;
        a plurality of capacitors positioned on the module PCB on the first side of the module PCB,
    wherein the capacitor module is coupled to the main module such that the capacitor module is positioned at the first end of the storage drive and the first side of the capacitor module faces the first side of the main module.

10. The information handling system of claim 9, wherein the storage drive is a solid-state drive (SSD) storage drive.

11. The information handling system of claim 9, wherein the capacitor module further includes a signal connector positioned on the first side of the capacitor module, the signal connector connecting the capacitor module to the main module to transmit signals between the capacitor module and the main module.

12. The information handling system of claim 11, wherein the signal connector includes multiple pins that directly contact pads of the main module.

13. The information handling system of claim 11, wherein the signal connector includes wires with connectors.

14. The information handling system of claim 9, wherein the flash memory components are positioned on the first side and the second side of the main PCB.

15. The information handling system of claim 14, wherein the plurality of capacitors face the flash memory elements that are positioned on the first side of the main PCB.

16. The information handling system of claim 9, wherein the controller module is positioned on the first side of the main PCB.

* * * * *